US011471981B2

(12) United States Patent
Hanada

(10) Patent No.: US 11,471,981 B2
(45) Date of Patent: Oct. 18, 2022

(54) TRANSPARENT MATERIAL PROCESSING METHOD, TRANSPARENT MATERIAL PROCESSING DEVICE, AND TRANSPARENT MATERIAL

(71) Applicant: HIROSAKI UNIVERSITY, Hirosaki (JP)

(72) Inventor: Yasutaka Hanada, Hirosaki (JP)

(73) Assignee: HIROSAKI UNIVERSITY, Hirosaki (JP)

( * ) Notice: Subject to any disclaimer, the term of this patent is extended or adjusted under 35 U.S.C. 154(b) by 141 days.

(21) Appl. No.: 16/958,099

(22) PCT Filed: Dec. 20, 2018

(86) PCT No.: PCT/JP2018/047072
§ 371 (c)(1),
(2) Date: Jun. 25, 2020

(87) PCT Pub. No.: WO2019/135362
PCT Pub. Date: Jul. 11, 2019

(65) Prior Publication Data
US 2021/0061650 A1    Mar. 4, 2021

(30) Foreign Application Priority Data
Jan. 5, 2018   (JP) .............................. JP2018-000508

(51) Int. Cl.
*B23K 26/57*    (2014.01)
*B23K 26/55*    (2014.01)
(Continued)

(52) U.S. Cl.
CPC .............. *B23K 26/57* (2015.10); *B23K 26/55* (2015.10); *B29C 35/0805* (2013.01);
(Continued)

(58) Field of Classification Search
CPC .... B23K 26/55; B23K 26/57; B23K 2103/42; B29C 35/0805; B81C 1/00071; B81C 99/0025
See application file for complete search history.

(56) References Cited

U.S. PATENT DOCUMENTS 3,909,582 A *  9/1975  Bowen ............... B23K 26/0846
                                                     383/207
6,672,552 B1 *  1/2004  Jao .......................... A47H 1/142
                                                     248/254

FOREIGN PATENT DOCUMENTS

CN          1531023 A      9/2004
CN          101508056 A    8/2009
(Continued)

OTHER PUBLICATIONS

International Preliminary Report on Patentability for related PCT App No. PCT/JP2018/047072 dated Jul. 16, 2020, 7 pgs.
(Continued)

*Primary Examiner* — Mathieu D Vargot
(74) *Attorney, Agent, or Firm* — Procopio, Cory, Hargreaves & Savitch, LLP

(57) ABSTRACT

A fabrication method of transparent material is a method of processing a thermosetting transparent material including a disposing step of disposing an uncured thermosetting transparent material, a laser beam irradiation step of irradiating the disposed uncured thermosetting transparent material with a laser beam so that cavitation bubbles are generated in the uncured thermosetting transparent material, and a curing step of performing a curing process on the uncured thermosetting transparent material in which the cavitation bubbles are generated.

7 Claims, 8 Drawing Sheets

(51) Int. Cl.
  *B29C 35/08* (2006.01)
  *B81C 1/00* (2006.01)
  *B81C 99/00* (2010.01)
  *B23K 103/00* (2006.01)
  *B29K 101/10* (2006.01)

(52) U.S. Cl.
  CPC ...... *B81C 1/00071* (2013.01); *B81C 99/0025* (2013.01); *B23K 2103/42* (2018.08); *B29C 2035/0838* (2013.01); *B29K 2101/10* (2013.01); *B81C 2201/0143* (2013.01)

(56) References Cited

FOREIGN PATENT DOCUMENTS

| | | | |
|---|---|---|---|
| CN | 107068291 A | 8/2017 | |
| DE | 10053078 A1 | 6/2001 | |
| JP | H08-097513 A | 4/1996 | |
| JP | H08156109 A | 6/1996 | |
| JP | H09216292 A | 8/1997 | |
| JP | 2004306134 A | 11/2004 | |
| JP | 2005079245 A | 3/2005 | |
| JP | 2007245460 A | 9/2007 | |
| JP | 2009136912 A | 6/2009 | |
| WO | 2013/132819 A1 | 9/2013 | |
| WO | 2017/057723 A | 4/2017 | |

OTHER PUBLICATIONS

Japanese Patent Office, Office Action, Application No. JP2019-563963, dated Sep. 6, 2022, in 4 pages.

* cited by examiner (a)

(b)

(a)

(b)

TRANSPARENT MATERIAL PROCESSING METHOD, TRANSPARENT MATERIAL PROCESSING DEVICE, AND TRANSPARENT MATERIAL

CROSS-REFERENCE TO RELATED APPLICATIONS

This application is a U.S. National Stage entry of PCT Application No: PCT/JP2018/047072 filed Dec. 20, 2018, which claims priority to Japanese Patent Application No. 2018-000508 filed Jan. 5, 2018, the contents of which are incorporated herein by reference.

TECHNICAL FIELD

The present invention relates to a fabrication method of transparent material and a transparent material fabrication system that process a transparent material which cures by heat and a transparent material.

BACKGROUND ART

A thermosetting transparent material represented by polydimethylsiloxane (PDMS) has excellent properties such as high transparency, chemical stability, light weight, and low cost. For that reason, the thermosetting transparent material has been used not only as a substrate in the industrial fields such as electronics and electricity but also in bio and medical fields as a material for biochips and medical devices in recent years. At present, molding or photolithography is mainly used as a micro and nanomachining technique for these materials. In addition, a laser processing can realize micro and nanomachining of an arbitrary shape of these materials just by scanning a laser beam. For instance, LIPAA method (for example, see Patent Literature 1) and LIBWE method (for example, see Patent Literature 2) using a conventional nanosecond laser are known to micromachine the transparent materials with high quality.

CITATION LIST

Patent Literature

Patent Literature 1: Japanese Unexamined Patent Publication No. 2005-079245
Patent Literature 2: Japanese Unexamined Patent Publication No. 2009-136912

SUMMARY OF INVENTION

Technical Problem

However, the conventional techniques described above have the following problems. In the case of molding, micro and nanomachining is realized by injection molding using a fabricated mold. However, since it requires a new mold in order to create an arbitrary new shape. Thus, there is a problem in terms of productivity and cost. The photolithography enables fine processing, but requires multiple steps that repeats the steps of light irradiation, etching, sputtering and so on. Furthermore, fabrication of deep groove is difficult. In the case of the deep groove-fabrication, the groove depth is limited to the order of several tens of $\mu m$. When exceeding that depth limit, multiple steps such as stacking and bonding are further required. For these reasons, rapid prototyping is difficult using both the molding and the photolithography techniques.

The LIPAA method and the LIBWE method using a conventional laser have a loss processing efficiency (speed). Furthermore, the LIPAA method has a problem that groove depth is limited to the order of several $\mu m$ and fabrication of deep groove requires a plurality of steps.

One embodiment of the invention has been made in view of the techniques described above and an object is to provide a simple and high efficient fabrication method of transparent material, a transparent material fabrication system, and a transparent material.

Solution to Problem

In order to achieve the object described above, a fabrication method of transparent material according to one embodiment of the invention is a fabrication method of transparent material for processing a transparent material which cures by heat, including: a disposing step of disposing an uncured transparent material; a laser beam irradiation step of irradiating the uncured transparent material disposed in the disposing step with a laser beam so that cavitation bubbles are generated in the uncured transparent material; and a curing step of performing a curing process on the uncured transparent material in which the cavitation bubbles are generated in the laser beam irradiation step.

In the fabrication method of transparent material according to one embodiment of the invention, the laser beam is irradiated to generate the cavitation bubbles in the uncured transparent material for the fabrication of the transparent material. In the fabrication method of transparent material according to one embodiment of the invention, a material can be processed simply and high efficiently.

In the disposing step, the uncured transparent material may be disposed so as to be in contact with a laser beam absorber and in the laser beam irradiation step, the laser beam absorber disposed in the disposing step may be irradiated with a laser beam through the uncured transparent material so that the cavitation bubbles are generated in the uncured transparent material. According to this configuration, since the laser beam absorber deposits to the processed portion of the transparent material, a plating process or the like for the processed portion of the transparent material can be easily performed.

The laser beam absorber may be metal and the fabrication method of transparent material may further include a plating step of performing a plating process on the transparent material having been cured in the curing step. According to this configuration, a metal wiring can be simply and high efficiently formed in the transparent material.

In the laser beam irradiation step, the laser beam absorber may be irradiated with a focused laser beam. According to this configuration, the irradiation of the laser can be more appropriately performed and the cavitation bubbles can be more appropriately generated. Accordingly, a material can be more appropriately processed.

In the disposing step, a transparent substance composed of at least one of a solid and a liquid may be disposed from an emission position of the irradiated laser beam to the uncured transparent material in the laser beam irradiation step to the uncured transparent material. According to this configuration, it is possible to prevent a variation in the refractive index of the path of the irradiated laser beam. As a result, the uncured transparent material can be appropriately irradiated with the laser beam to be processed appropriately.

Further, a transparent material fabrication system that can be used in the fabrication method of transparent material according to one embodiment of the invention is also the invention having a novel configuration. The transparent material fabrication system according to one embodiment of the invention is a transparent material fabrication system for processing a transparent material which cures by heat, including: a container which accommodates an uncured transparent material; a laser beam irradiation system which irradiates a laser beam to the uncured transparent material accommodated in the container; and a moving means for moving at least one of the container and the laser beam irradiation system so as to move an irradiation position of the laser beam of the laser beam irradiation system in the uncured transparent material accommodated in the container.

The transparent material fabrication system may further include a transparent substance which is composed of at least one of a solid and a liquid and is disposed from an emission position of the irradiated laser beam to the uncured transparent material in the laser beam irradiation system to the uncured transparent material.

Further, a transparent material that is cured by heat and is processed in accordance with the fabrication method of transparent material according to one embodiment of the invention is also the invention having a novel configuration.

Advantageous Effects of Invention

In one embodiment of the invention, the transparent material is fabricated by the laser-induced cavitation bubbles generated in the uncured transparent material. According to one embodiment of the invention, a material can be processed simply and high efficiently.

DESCRIPTION OF EMBODIMENTS

Figure 1:
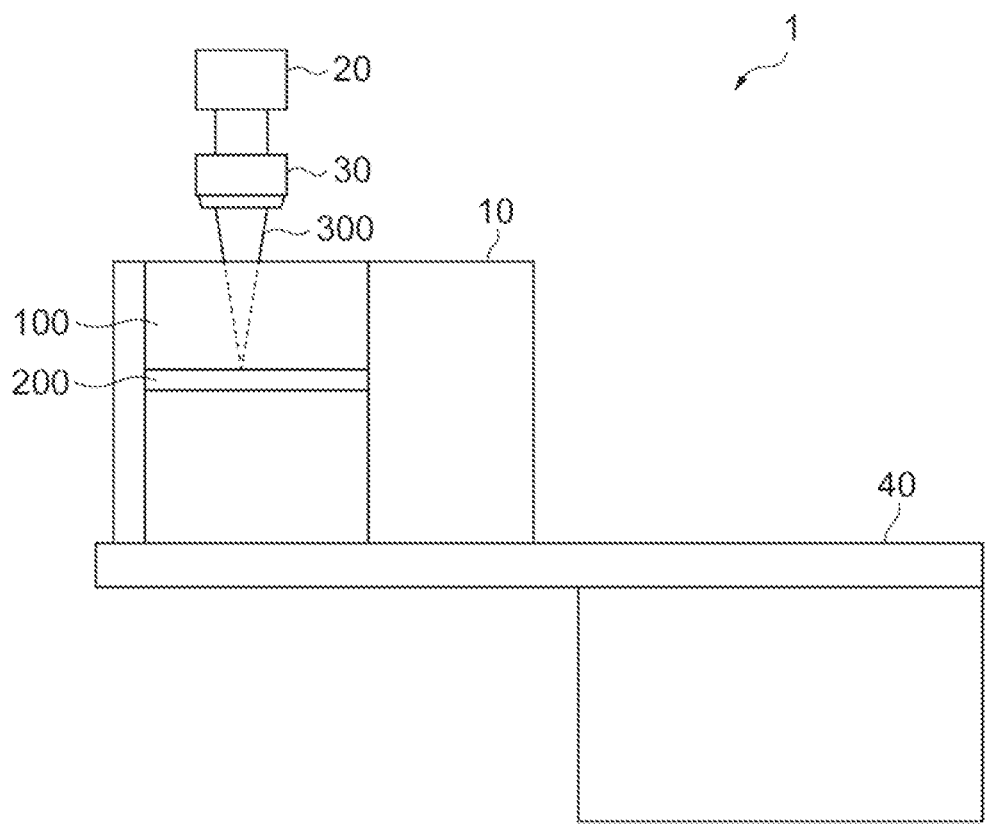
FIG. 1 is a diagram illustrating a processing device used in a fabrication method of transparent material according to an embodiment of the invention.

Hereinafter, embodiments of a fabrication method of transparent material, a transparent material fabrication system, and a transparent material according to the invention will be described in detail with reference to the drawings. Additionally, in the description of the drawings, the same components will be denoted by the same reference numerals and a redundant description will be omitted. Further, the dimensional ratios in the drawings do not always match those in the description.

The fabrication method of transparent material according to the embodiment is a method of processing a transparent material which cures by heat, for example, a thermosetting transparent material. As the thermosetting transparent material corresponding to a processing target, there are transparent thermosetting resins such as PDMS (silicone), epoxy, unsaturated polyester, polyurethane, melamine, and urea.

In the fabrication according to the embodiment, for example, fine grooves having a width of about several µm to several tens of µm are provided on the surface of the thermosetting transparent material. In the fabrication according to the embodiment, fine holes may be provided on the surface of the thermosetting transparent material other than the groove. Further, in the fabrication according to the embodiment, a metal thin film that can be used as a metal wiring may be formed in the fabricated groove.

FIG. 1 illustrates a processing device 1 used to perform the fabrication method of transparent material according to the embodiment. That is, the processing device 1 is a transparent material fabrication system according to the embodiment that processes the transparent material. As illustrated in FIG. 1, the processing device 1 includes a container 10, a laser beam source 20, a focusing lens 30, and an automatic stage 40.

The container 10 is a container that accommodates a thermosetting transparent material 100 of the processing target and a laser beam absorber 200 used in the fabrication. For example, a transparent container is used as the container 10. The shape of the uncured thermosetting transparent material 100 of the processing target reflects the shape of the container 10. The shape of the container 10 is adapted accordingly.

As illustrated in FIG. 1, the laser beam absorber 200 is put in the lower part of the container 10. As the laser beam absorber 200, a metal plate (for example, a copper plate) is used. However, a material other than metal may be used as the laser beam absorber 200. The thermosetting transparent material 100 before heat curing, that is, the uncured liquid thermosetting transparent material 100 is put on the laser beam absorber 200 in the container 10. In the container 10, the thermosetting transparent material 100 before heat curing is placed on one surface of the plate-shaped laser beam absorber 200, that is, the thermosetting transparent material 100 is in contact with the laser beam absorber 200. A portion, that is in contact with the laser beam absorber 200, of the thermosetting transparent material 100 is a portion to be processed.

The laser beam source 20 is a device that emits a laser beam 300 used for processing the thermosetting transparent material 100. The wavelength of the laser beam 300 from the laser beam source 20 is a wavelength that is transparent to the thermosetting transparent material 100 before heat curing (a wavelength that passes through the thermosetting transparent material 100 before heat curing). That is, the thermosetting transparent material 100 may be transparent to the wavelength of the laser beam 300 before thermosetting. As the laser beam source 20, a light source of a practical laser such as a conventional YAG laser can be used.

The focusing lens 30 is a lens that focuses the laser beam 300 emitted from the laser beam source 20 and emits the laser beam. The laser beam absorber 200 is irradiated with the laser beam 300 emitted from the focusing lens 30 through the thermosetting transparent material 100. At that time, the position (surface) of the laser beam absorber 200 is set as the focus position of the laser beam 300. The laser beam source 20 and the focusing lens 30 are positioned and disposed so that the laser beam absorber 200 is irradiated with the laser beam 300 in this way. Further, an optical system other than the laser beam source 20 and the focusing lens 30 may be disposed. For the focusing lens 30, a conventional objective lens can be used. For example, an objective lens having a magnification of 20 times and a numerical aperture (NA) of 0.35 can be used as the focusing lens 30. The laser beam source 20 and the focusing lens 30 constitute a laser beam irradiation system that irradiates the laser beam 300 to the transparent material before heat curing accommodated in the container 10. Additionally, the laser beam irradiation system may have a configuration other than the above-described one.

The automatic stage 40 is a stage that can determine the irradiation position of the laser beam 300, that is, the processing position of the thermosetting transparent material 100. The container 10 is placed on the automatic stage 40. As the automatic stage 40, a conventional automatic stage that is driven in all directions of the XYZ axes can be used. The automatic stage 40 is a moving means for moving the container 10 so that the position of the laser beam 300 irradiated by the laser beam source 20 and the focusing lens 30 in the uncured transparent material accommodated in the container 10 moves. Additionally, the irradiation position of the laser beam 300 may be determined by moving the emission position of the laser beam 300 instead of moving the automatic stage 40, that is, the container 10. Further, both of them may be moved. That is, the moving means may be one that moves at least one of the container 10 and the laser beam irradiation system so that the position of the laser beam irradiated by the laser beam irradiation system in the transparent material before heat curing accommodated in the container 10 moves. The above is the processing device 1 used to perform the fabrication method of transparent material according to the embodiment.

Figure 2:
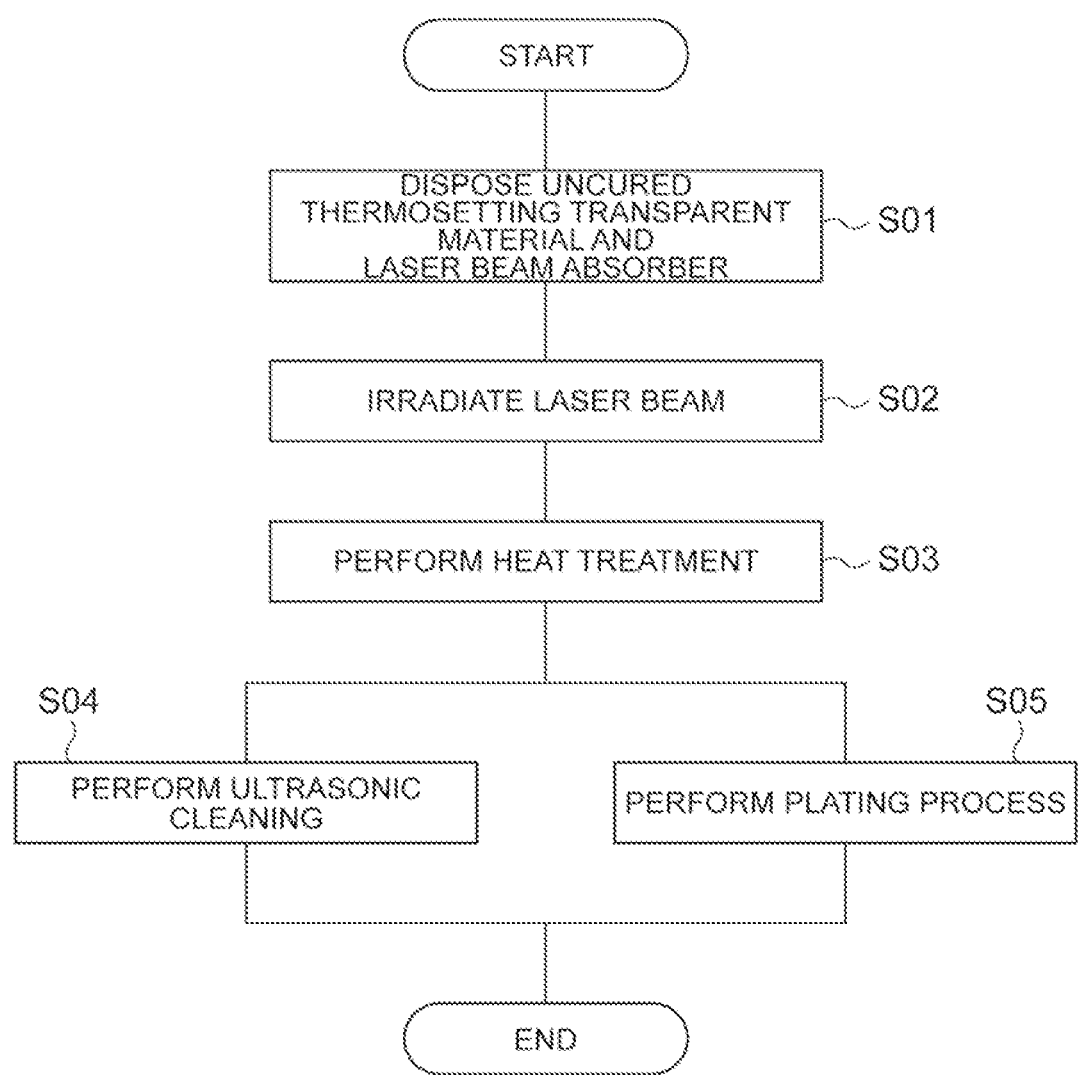
FIG. 2 is a flowchart illustrating the fabrication method of transparent material according to the embodiment of the invention.
Figure 3:
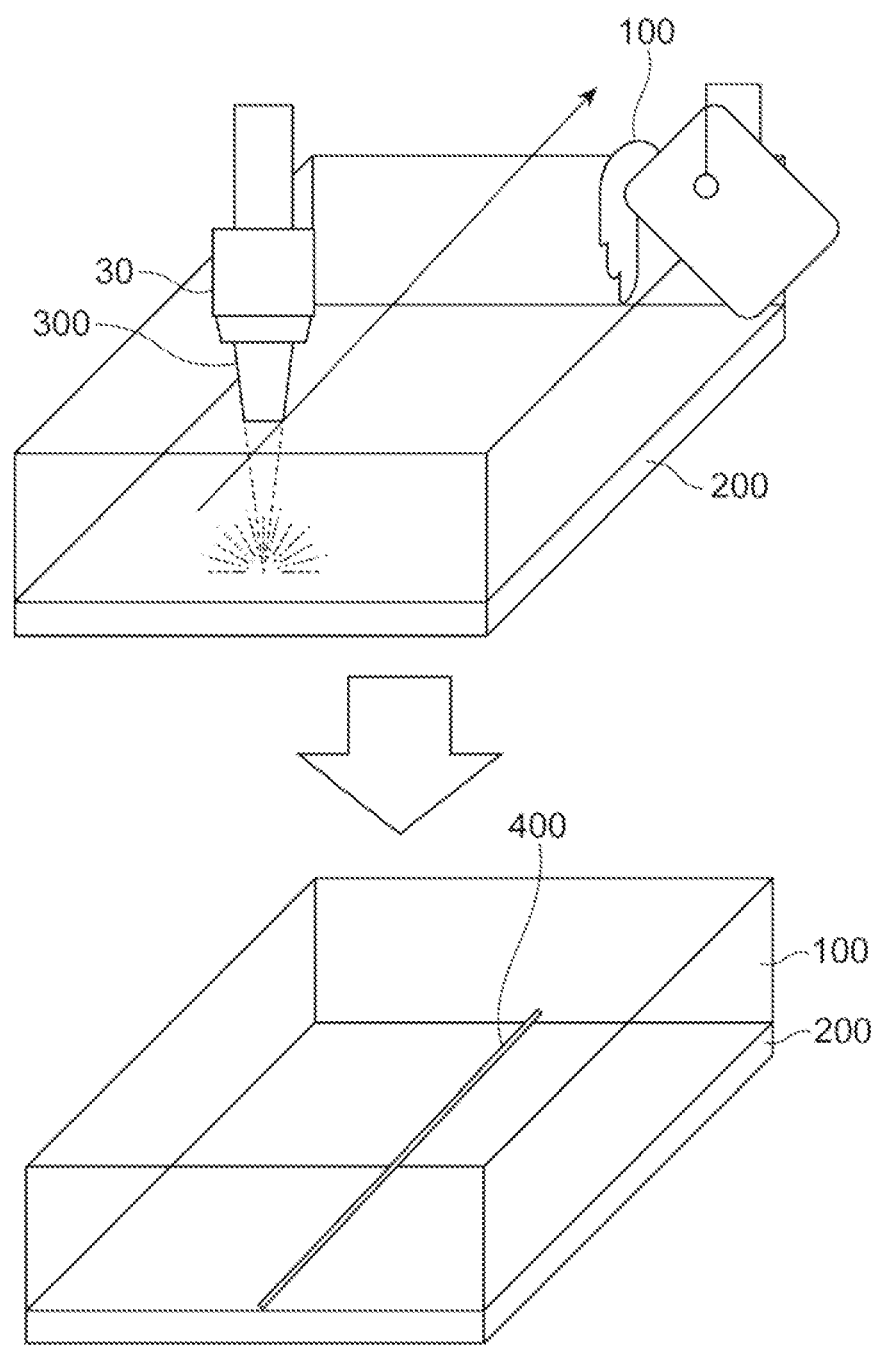
FIG. 3 is a diagram schematically illustrating the arrangement of a thermosetting transparent material and a laser beam absorber and the scanning of a laser beam.

Next, the fabrication method of transparent material according to the embodiment will be described with reference to the flowchart of FIG. 2. First, the thermosetting transparent material 100 before heat curing and the laser beam absorber 200 are disposed in the container 10 (S01, disposing step). The disposing is performed by, for example, an operator. At this time, as illustrated in FIG. 1, the thermosetting transparent material 100 is disposed so as to be in contact with the laser beam absorber 200. For example, as illustrated in the upper diagram of FIG. 3, the disposing is performed in such a manner that the thermosetting transparent material 100 before heat curing is poured into the container 10 where the laser beam absorber 200 is disposed.

Next, the laser beam absorber 200 is irradiated with the laser beam 300 emitted from the laser beam source 20 and focused by the focusing lens 30 through the thermosetting transparent material 100 (S02, laser beam irradiation step). Cavitation bubbles are generated in the thermosetting transparent material 100 at the irradiation position by the irradiation of the laser beam 300 with respect to the laser beam absorber 200. The irradiation position on the laser beam absorber 200 is moved by the automatic stage 40. That is, the laser beam 300 is scanned (moved) on the laser beam absorber 200. The scanning of the laser beam 300 is performed on the processing areas of the thermosetting transparent material 100 and is performed by an operator's operation, a preset setting, or the like.

Figure 4:
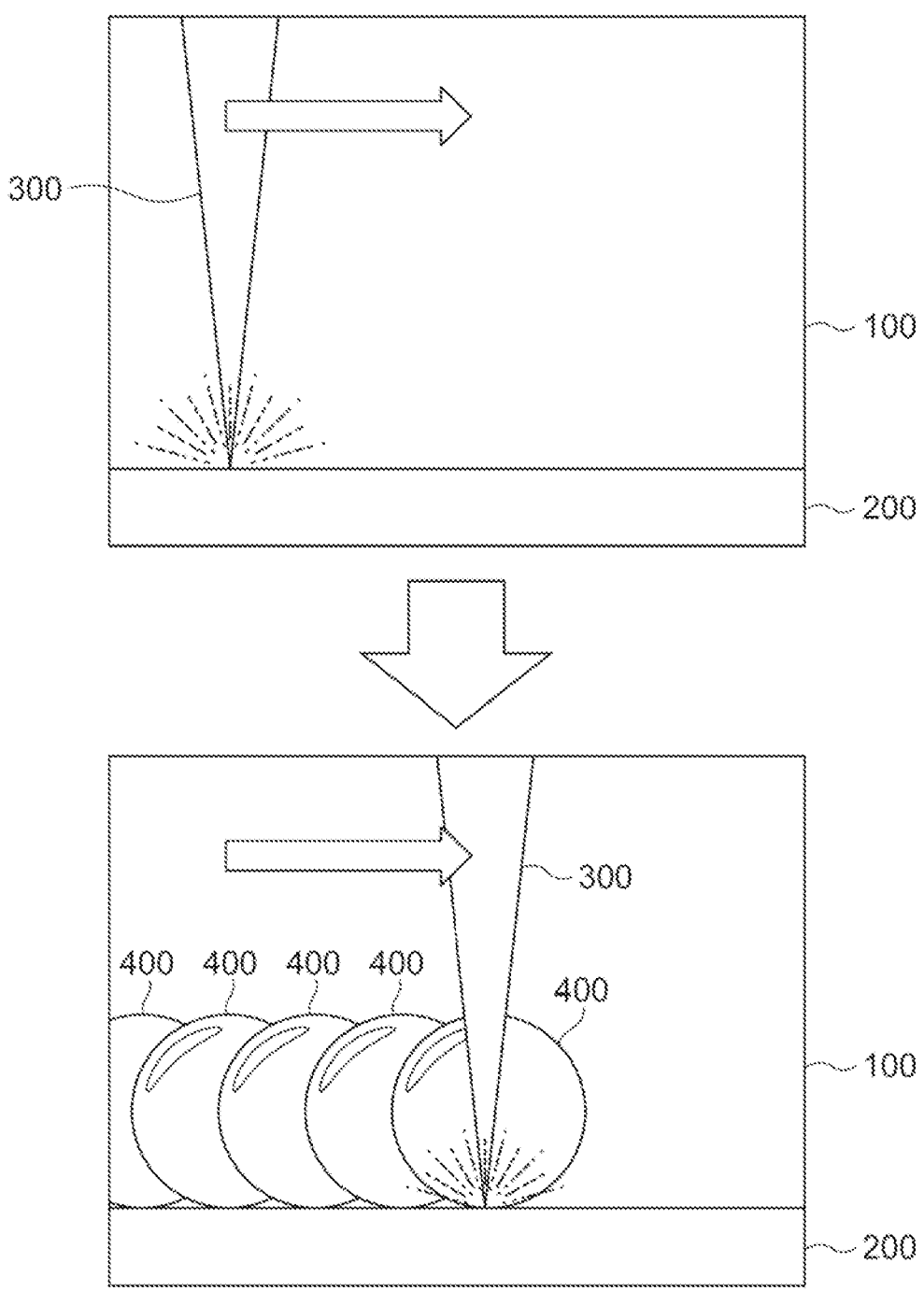
FIG. 4 is a diagram schematically illustrating the generation of cavitation bubbles.

As illustrated in FIG. 4, a cavitation bubble 400 is generated at each irradiation position. When the laser beam 300 is scanned in a linear manner as illustrated in the upper diagram of FIG. 3, the cavitation bubbles 400 are generated in the thermosetting transparent material 100 so as to be continuous in a linear manner (in a line) as illustrated in the lower diagram of FIG. 3.

The cavitation bubbles 400 are sustainably present in the thermosetting transparent material 100. The thermosetting transparent material 100 in which the cavitation bubbles 400 are generated after the irradiation of the laser beam 300 is heat-treated (cured) together with container 10 so that the thermosetting transparent material 100 is thermally cured (S03, curing step). The heat treatment is performed similarly to the conventional heat treatment for the thermosetting transparent material 100.

A portion of the cavitation bubble 400 in the thermosetting transparent material 100 after heat curing becomes hemispherical shape. That is, the fabrication of the thermosetting transparent material 100 reflects the shape of the cavitation bubble 400 serving as a mold. When the cavitation bubbles 400 are generated to be continuous in a linear manner as described above in the example, a linear groove is formed in the thermosetting transparent material 100.

The size (shape) of the cavitation bubble 400 can be controlled by the irradiation condition of the laser beam 300 (for example, the power and the irradiation time of the laser beam 300). In general, when each of the power and the irradiation time of the laser beam 300 is increased, the size of the cavitation bubble 400 increases. The size control can be performed on the order of μm. These controls are performed, for example, by providing an optical system (for example, a spatial light modulator or an axicon lens) for controlling the wavefront of the laser beam 300 on the optical path of the laser beam 300.

The thermosetting transparent material 100 after heat curing is taken out from the container 10. When metal is used as the laser beam absorber 200, small metallic particles deposit to the processed areas (groove). In case of removing the small metallic particles, ultrasonic cleaning with a solvent such as hydrochloric acid is performed after heat curing (S04).

On the other hand, the processed areas (groove), that is, the fabricated areas of the thermosetting transparent material 100 may be applied to a plating process without removing the small metallic particles (S05, plating step). The plating process can be performed, for example, by immersing the thermosetting transparent material 100 in a plating solution as in a conventional manner. Accordingly, a metal thin film that can be used as a metal wiring can be deposited only on the processed areas (groove). That is, a selective metallization on the processed area can be performed. The above is the fabrication method of transparent material according to the embodiment.

As described above, in the embodiment, the cavitation bubbles 400 are generated in the uncured thermosetting transparent material 100 by the irradiation of the laser beam 300 so that the thermosetting transparent material 100 is fabricated. According to the embodiment, high quality fabrication can be performed in a small number of steps as compared with molding and photolithography techniques and rapid prototyping can be performed. Specifically, according to the embodiment, the time required for this process can be reduced to about ⅕ to ⅒ compared with the lithography technique. Furthermore, in the embodiment, since a practical laser can be used, expensive equipment such as a clean room required for lithography is not required.

Further, in the embodiment, since the fabrication is performed using the cavitation bubbles 400 generated in the uncured liquid thermosetting transparent material 100, the process can be performed with high efficiency (high speed) as compared with the LIPAA method and the LIBWE method which perform solid material fabrication. For example, according to the embodiment, deep grooving can be easily realized as compared with the LIPAA method and the LIBWE method. Specifically, in the LIPAA method and the LIBWE method, there is a limit of groove depth on the order of several μm with one shot laser irradiation, but in the embodiment, further deep grooving can be easily realized. In this way, according to the embodiment, a material can be fabricated simply and high efficiently. Further, the thermosetting transparent material 100 which is fabricated by the fabrication method of transparent material according to the embodiment is a transparent material according to the embodiment.

Further, as in the embodiment, the thermosetting transparent material 100 before heat curing may be disposed so as to be in contact with the laser beam absorber 200 in the disposing step and the laser beam absorber 200 may be irradiated with a laser beam through the uncured thermosetting transparent material 100 in the laser beam irradiation step so that the cavitation bubbles 400 are generated in the uncured thermosetting transparent material 100. According to this configuration, since the laser beam absorber 200 which is ablated during the generation of the cavitation bubbles 400 deposits to the processed portion of the thermosetting transparent material 100, the processed portion of the thermosetting transparent material 100 can be easily applied to a plating process or the like. However, the laser beam absorber 200 does not need to be essentially used for fabricating the thermosetting transparent material 100. When the laser beam absorber 200 is not used, simply, the laser irradiation in the uncured thermosetting transparent material 100 may be conducted to generate the cavitation bubbles for the fabrication.

Further, as in the embodiment, a metal plate may be used as the laser beam absorber 200 and a plating process may be performed so that a metal thin film is formed on the processed thermosetting transparent material 100. According to this configuration, a metal wiring can be simply and high efficiently formed in the thermosetting transparent material 100. For example, the LIBWE method requires a new step in order to form a metal wiring in the processed area, but in the embodiment, a metal wiring can be easily formed as compared with the new step. However, when the metal thin film does not need to be formed, the plating process does not need to be performed. For example, as described above, the small metallic particles of the processed portion may be removed by ultrasonic cleaning or the like. Further, in this case, a material other than metal may be used as the laser beam absorber 200.

Further, as in the embodiment, the laser beam 300 may be focused and irradiated by the focusing lens 30. According to this configuration, the irradiation of the laser beam can be more appropriately performed and the cavitation bubbles 400 can be more appropriately generated. Accordingly, the thermosetting transparent material 100 can be more appropriately processed. However, the focusing of the laser beam 300 does not need to be essentially performed depending on the power of the laser beam 300. When the focusing is not required, the processing resolution reflects the beam diameter of the laser beam 300.

Additionally, in the embodiment, the processing target is the thermosetting transparent material, but a material other than the thermosetting transparent material may be the processing target as long as the material is the transparent material which cures by heat. The thermosetting transparent material is cured by heat, but a material (for example, glass) cured by cooling, different from the thermosetting transparent material, may also be the processing target. Further, in the embodiment, an example in which the uncured thermosetting transparent material 100 contacts the laser beam absorber 200 in the vertical direction has been described, but the invention is not limited to this contact and may be any contact.

Figure 5:
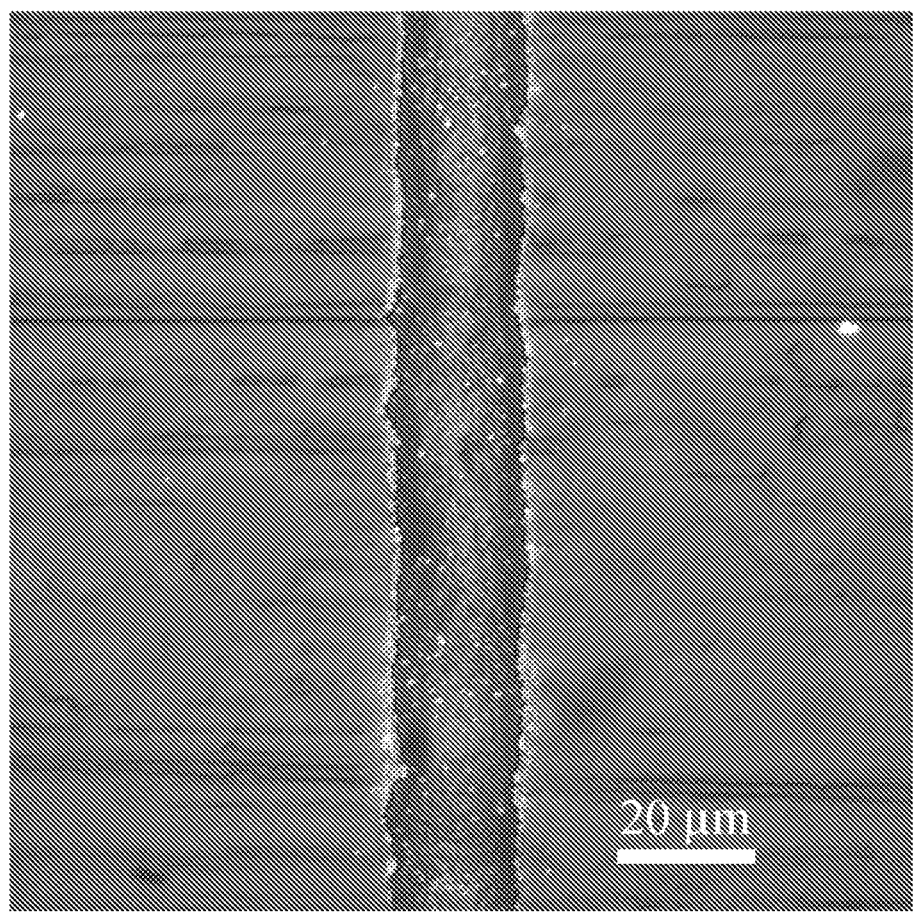
FIG. 5 is a diagram showing a processed groove according to the embodiment of the invention.
Figure 5:
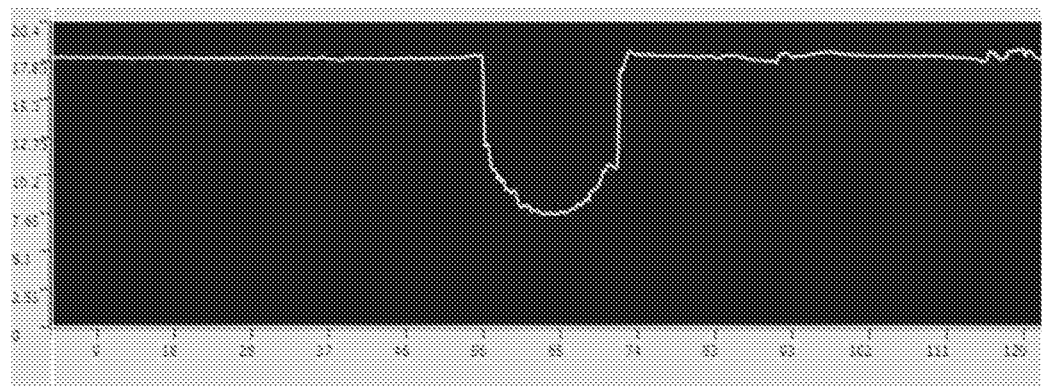
Figure 6:
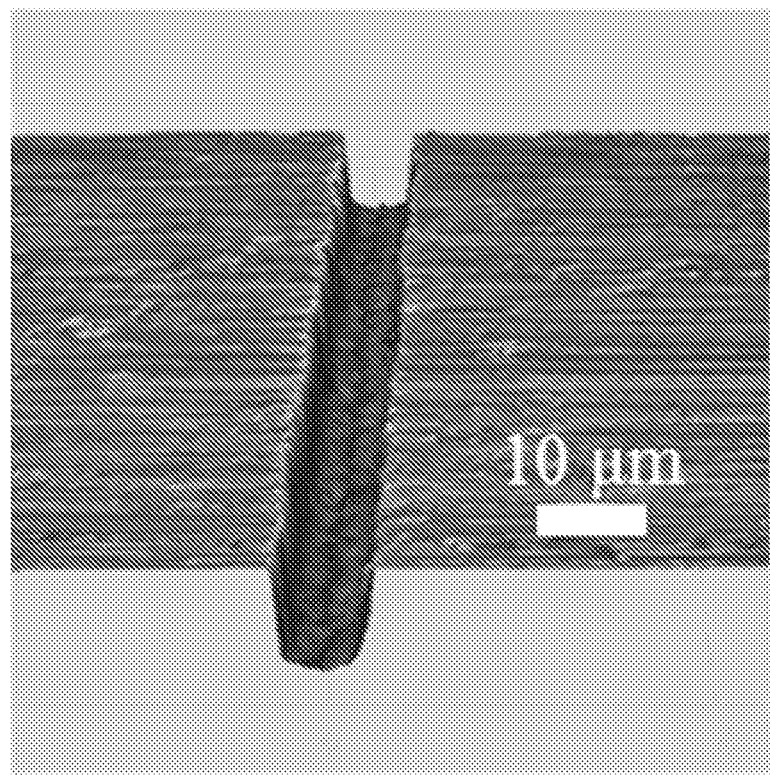
FIG. 6 is a diagram showing a processed groove according to the embodiment of the invention.
Figure 7:
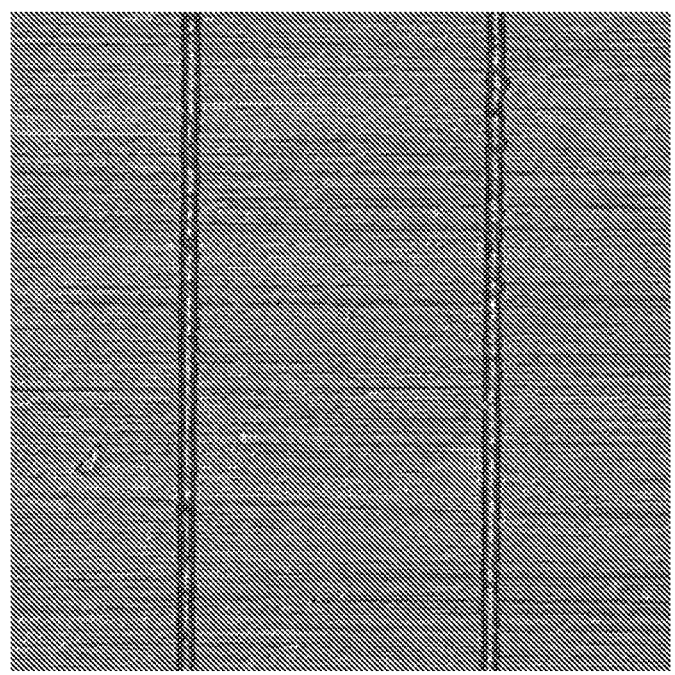
FIG. 7 is a diagram showing a groove and a plating processed according to the embodiment of the invention.
Figure 7:
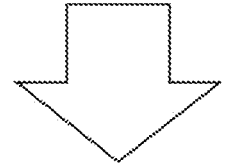
Figure 7:
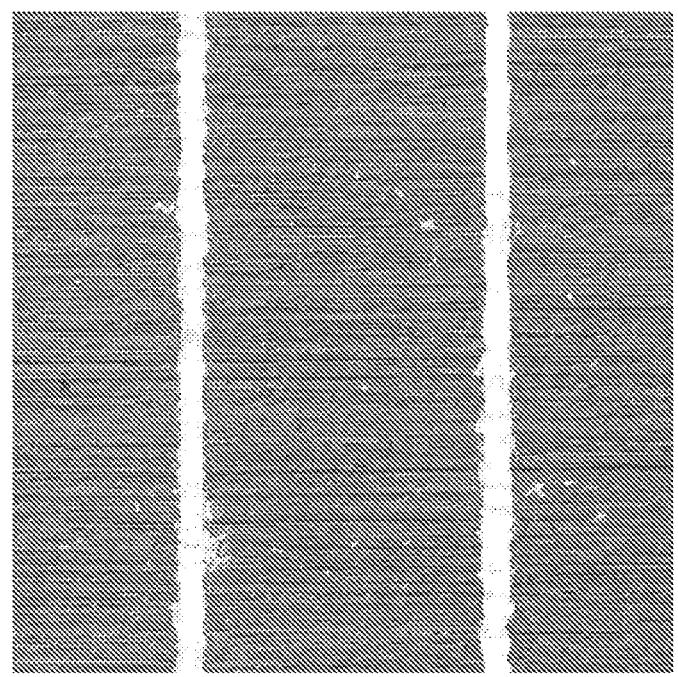

FIG. 5 shows an example of the groove formed in the thermosetting transparent material 100 (PDMS) by the embodiment. FIG. 5(a) is a top view of the groove and FIG. 5(b) is a cross-sectional view of the groove. An aspect ratio between the depth and the width of the groove fabricated in most of the irradiation conditions of the laser beam 300 becomes to be about 1:1 as shown in FIG. 5(b). FIG. 6 shows an example of a laser microscope image (magnification: 100 times) of the groove formed in the thermosetting transparent material 100 (PDMS) by the embodiment. The power of the laser beam 300 is 1 μJ/pulse and the scanning speed is 5000 μm/s. The aspect ratio is about 1:1. FIG. 7(a) shows a reflection microscope image (magnification: 20 times) of the groove formed in the thermosetting transparent material 100 (PDMS) by the embodiment and FIG. 7(b) shows a reflection microscope image (magnification: 20 times) of the plated groove. As shown in FIGS. 5 to 7, according to the embodiment, the thermosetting transparent material 100 (PDMS) can be appropriately processed.

Next, a modified example of the embodiment will be described. In the embodiment described above, a groove is provided on the surface of the thermosetting transparent material 100. The fabrication according to the embodiment of the invention is not limited to the fabrication of a groove on the thermosetting transparent material 100 and can be also applied when forming a through-hole or a hole (deep groove) that does not penetrate the thermosetting transparent material 100.

In that case, a portion irradiated with the laser beam 300 (a focus position of the laser beam 300) is a portion corresponding to a portion of a through-hole formed in the thermosetting transparent material 100 or a portion of a hole which does not penetrate. For example, in FIGS. 1, 3, and 4, a portion irradiated with the laser beam 300 is scanned (moved) in the vertical direction (the up and down direction of the drawing). Specifically, the focused laser beam 300 is shifted upward from the bottom in the horizontal direction with respect to the optical axis. Such scanning can be realized by moving the emission position of the laser beam 300 using the laser beam source 20 and the focusing lens 30 along the optical axis of the laser beam or moving the automatic stage 40 along the optical axis of the laser beam.

Further, a transparent substance composed of at least one of a solid and a liquid may be disposed from the emission position of the laser beam 300 to the uncured liquid thermosetting transparent material 100 before the laser irradiation of uncured liquid thermosetting transparent material 100 by the laser beam 300, that is, in the disposing step. For example, a glass plate is disposed on the uncured thermosetting transparent material 100 and, water film is placed on the glass plate, and the focusing lens 30 corresponding to the emission position of the laser beam 300 is immersed in the water film. In this configuration, the emitted laser beam 300 shines the uncured thermosetting transparent material 100 through the water and the glass plate.

The configuration described above is set when considering of the refractive index of the path of the laser beam 300. For example, the refractive index of the PDMS that is the uncured liquid thermosetting transparent material 100 is about 1.41. When the glass plate and the water film are not provided, the laser beam 300 passes through air and the uncured thermosetting transparent material 100 through air. Since the refractive index of the air is about 1, a difference in the refractive index with the uncured thermosetting transparent material 100 increases. Since the refractive index of the glass plate is about 1.45 and the refractive index of the water is about 1.3, a difference in the refractive index with the uncured thermosetting transparent material 100 can be decreased. According to this configuration, it is possible to prevent the refractive index change in the path of the irradiated laser beam 300. As a result, since the uncured thermosetting transparent material 100 can be appropriately irradiated with the laser beam 300, and the material can be appropriately fabricated.

Additionally, even when the emission position of the laser beam 300, that is, the focusing lens 30 is moved in the vertical direction as described above in the modified example, the water remains in contact with the focusing lens 30 due to the surface tension of the water if the moving length is short, for example, about 1500 μm.

Further, the transparent substance provided in the path of the laser beam 300 is not limited to the glass plate and the water and may be a transparent substance composed of at least one of a solid and a liquid preventing the refractive index change. Further, the transparent substance may be a combination of the solid (glass plate) and the liquid (water) as described above. Further, the transparent substance may be included in the processing device 1.

Further, in the embodiment including the modified example, the viscosity of the uncured liquid thermosetting transparent material 100 may be adjusted so that the generated cavitation bubbles 400 do not move and are stably located at the uncured thermosetting transparent material 100.

Figure 8:
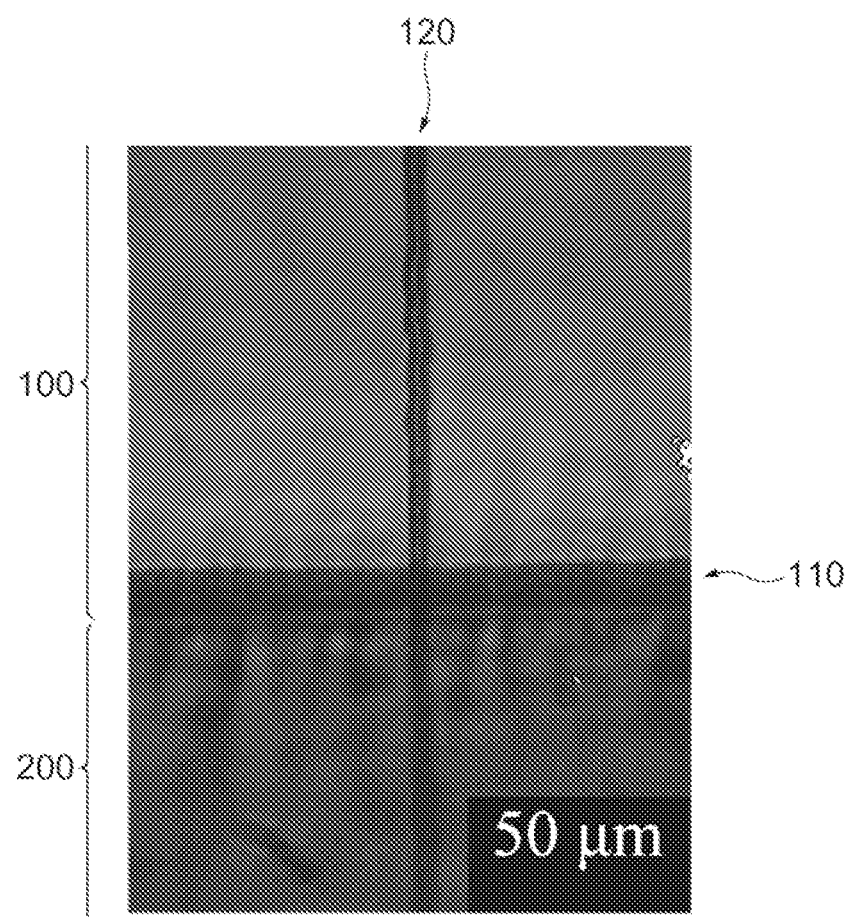
FIG. 8 is a diagram showing a processed groove according to the embodiment of the invention.

FIG. 8 shows an example of the groove formed in the PDMS that is the thermosetting transparent material 100 by the embodiment and the modified example. In FIG. 8, the thermosetting transparent material 100 is placed on a copper plate that is the laser beam absorber 200. A groove 110 which is formed at the boundary of the laser beam absorber 200 is fabricated by the embodiment described above. A groove (through-hole) 120 which extends vertically from the laser beam absorber 200 is formed by the modified example described above. That is, the grooves 110 and 120 are formed in a T shape. Such grooves 110 and 120 can be used as microfluidic channel. The height of the groove 120 from the laser beam absorber 200 (the thickness of the laser beam absorber 200) in the extension direction of the groove 120 is about 1500 μm and the groove 120 (that is, the through-hole) is formed in the entire length. The height of the groove 120 from the laser beam absorber 200 shown in FIG. 8 is 173.8 μm.

The width of the groove 120 is about 7.4 μm. An aspect ratio between the length and the width of the groove 120 is about 202 (1500/7.4). In this way, a groove having an aspect ratio of 200 or more can be formed without using methods such as stacking and bonding the thermosetting transparent material 100.

In order to achieve the above-described object, a fabrication method of transparent material according to one embodiment of the invention is a fabrication method of transparent material for processing a transparent material which cures by heat, including: a disposing step of disposing an uncured transparent material so as to be in contact with a laser beam absorber; a laser beam irradiation step of irradiating the laser beam absorber disposed in the disposing step with a laser beam through the uncured transparent material so that cavitation bubbles are generated in the uncured transparent material; and a curing step of performing a curing process on the uncured transparent material in which the cavitation bubbles are generated in the laser beam irradiation step.

In the fabrication method of transparent material according to one embodiment of the invention, the laser beam is irradiated so as to fabricate the transparent material by cavitation bubbles generated in the uncured transparent material. For this reason, in the fabrication method of transparent material according to one embodiment of the invention, a material can be processed simply and high efficiently.

The laser beam absorber is metal and the fabrication method of transparent material may further include a plating step of performing a plating process on the transparent material having been cured in the curing step. According to this configuration, a metal wiring can be simply and high efficiently formed in the transparent material.

In the laser beam irradiation step, the laser beam absorber may be irradiated with a focused laser beam. According to this configuration, the irradiation of the laser can be more appropriately performed and cavitation bubbles can be more appropriately generated. Accordingly, a material can be more appropriately processed.

REFERENCE SIGNS LIST

1: processing device, 10: container, 20: laser beam source, 30: focusing lens, 40: automatic stage, 100: thermosetting transparent material, 200: laser beam absorber, 300: laser beam, 400: cavitation bubble.

The invention claimed is:

1. A fabrication method of transparent material for processing a transparent material which cures by heat, the fabrication method comprising:
   disposing in a container an uncured transparent material in a liquid state;
   irradiating the uncured transparent material with a laser beam so that cavitation bubbles are generated in the uncured transparent material; and
   performing a curing process on the uncured transparent material in which the cavitation bubbles are generated.

2. The fabrication method of transparent material according to claim 1, wherein, the uncured transparent material is disposed so as to be in contact with a laser beam absorber, and
   wherein, the laser beam absorber is irradiated with a laser beam through the uncured transparent material so that the cavitation bubbles are generated in the uncured transparent material.

3. The fabrication method of transparent material according to claim 2, wherein the laser beam absorber is metal, and
   wherein the fabrication method of transparent material further comprises performing a plating process on the transparent material having been cured.

4. The fabrication method of transparent material according to claim 2, wherein, the laser beam absorber is irradiated with a focused laser beam.

5. The fabrication method of transparent material according to claim 1, wherein a transparent substance, composed of at least one of a solid and a liquid, is disposed from an emission position of the irradiated laser beam to the uncured transparent material.

6. The fabrication method of transparent material according to claim 1, wherein a transparent substance, including at least one of a solid and a liquid, is disposed without a gap between an emission position of the irradiated laser beam and the uncured transparent material.

7. The fabrication method of transparent material according to claim 1, wherein a transparent substance, including at least one of a solid and a liquid, is continuously disposed from the uncured transparent material to an emission position of the irradiated laser beam.

* * * * *